(12) United States Patent
Vierheilig et al.

(10) Patent No.: US 11,128,106 B2
(45) Date of Patent: Sep. 21, 2021

(54) METHOD OF PRODUCING A LASER DIODE BAR AND LASER DIODE BAR

(71) Applicant: OSRAM Opto Semiconductors GmbH, Regensburg (DE)

(72) Inventors: Clemens Vierheilig, Tegernheim (DE); Andreas Löffler, Neutraubling (DE); Sven Gerhard, Alteglofsheim (DE)

(73) Assignee: OSRAM OLED GmbH, Regensburg (DE)

( * ) Notice: Subject to any disclaimer, the term of this patent is extended or adjusted under 35 U.S.C. 154(b) by 247 days.

(21) Appl. No.: 16/305,908

(22) PCT Filed: Jun. 13, 2017

(86) PCT No.: PCT/EP2017/064404
§ 371 (c)(1),
(2) Date: Nov. 30, 2018

(87) PCT Pub. No.: WO2017/216157
PCT Pub. Date: Dec. 21, 2017

(65) Prior Publication Data
US 2020/0287355 A1    Sep. 10, 2020

(30) Foreign Application Priority Data

Jun. 16, 2016   (DE) .................... 10 2016 111 058.2

(51) Int. Cl.
*H01S 5/40*    (2006.01)
*H01S 5/042*   (2006.01)
(Continued)

(52) U.S. Cl.
CPC .......... *H01S 5/4031* (2013.01); *H01S 5/0014* (2013.01); *H01S 5/02345* (2021.01);
(Continued)

(58) Field of Classification Search
CPC .. H01S 5/4031; H01S 5/04256; H01S 5/0014; H01S 5/02276; H01S 5/0421;
(Continued)

(56) References Cited

U.S. PATENT DOCUMENTS 6,266,353 B1    7/2001   Freitas et al.
9,680,049 B2    6/2017   Plößl
(Continued)

FOREIGN PATENT DOCUMENTS

CN    105122472 A    12/2015
DE    10 13 265 A1   10/2001
(Continued)

OTHER PUBLICATIONS

Notification of Reasons for Refusal dated Jan. 7, 2020, of counterpart Japanese Application No. 2018-565815, along with an English translation.
(Continued)

*Primary Examiner* — Michael Carter
(74) *Attorney, Agent, or Firm* — DLA Piper LLP (US)

(57) ABSTRACT

A method of producing a laser diode bar includes producing a plurality of emitters arranged side by side, emitters each including a semiconductor layer sequence having an active layer that generates laser radiation, a p-contact on a first main surface of the laser diode bar and an n-contact on a second main surface of the laser diode bar opposite the first main surface, testing at least one optical and/or electrical property of the emitters, wherein emitters in which the optical and/or electrical property lies within a predetermined setpoint range are assigned to a group of first emitters, and emitters in which the at least one optical and/or electrical property lies outside the predetermined setpoint range are assigned to a group of second emitters, and electrically contacting first emitters, wherein second emitters are not
(Continued)

electrically contacted so that they are not supplied with current during operation of the laser diode bar.

9 Claims, 3 Drawing Sheets

(51) Int. Cl.
    *H01S 5/00*     (2006.01)
    *H01S 5/02345*     (2021.01)
    *H01S 5/024*     (2006.01)
    *H01S 5/22*     (2006.01)
    *H01S 5/323*     (2006.01)

(52) U.S. Cl.
    CPC ........ *H01S 5/0421* (2013.01); *H01S 5/04256* (2019.08); *H01S 5/02469* (2013.01); *H01S 5/22* (2013.01); *H01S 5/32341* (2013.01)

(58) Field of Classification Search
    CPC .... H01S 5/02469; H01S 5/22; H01S 5/32341; H01S 5/04257
    See application file for complete search history.

(56) References Cited

U.S. PATENT DOCUMENTS

| | | |
|---|---|---|
| 2002/0172244 A1 | 11/2002 | Li et al. |
| 2003/0076863 A1 | 4/2003 | Zelenka |
| 2004/0005728 A1 | 1/2004 | Sugahara et al. |
| 2006/0104565 A1 | 5/2006 | Shimada et al. |
| 2007/0176262 A1 | 8/2007 | Sirkin |
| 2008/0025361 A1 | 1/2008 | Jerman et al. |
| 2009/0032908 A1* | 2/2009 | Masui ............... H01L 22/12 257/623 |
| 2009/0065800 A1 | 3/2009 | Wirth et al. |
| 2015/0236472 A1* | 8/2015 | Ide ............... G02B 6/0005 362/553 |

FOREIGN PATENT DOCUMENTS

| | | |
|---|---|---|
| DE | 100 13 265 A1 | 10/2001 |
| JP | S62-172052 U | 10/1987 |
| JP | S63-164285 A | 7/1988 |
| JP | H06-59168 A | 3/1994 |
| JP | 2002-252419 A | 9/2002 |
| JP | 2002-261398 A | 9/2002 |
| JP | 2002-270939 A | 9/2002 |
| JP | 2003-347675 A | 12/2003 |
| JP | 2006-128236 A | 5/2006 |
| JP | 2007-523483 A | 8/2007 |
| JP | 2010-192672 A | 9/2010 |
| JP | 2011-233717 A | 11/2011 |
| WO | 2015/012025 A | 1/2015 |

OTHER PUBLICATIONS

The Second Office Action dated Aug. 5, 2020, of counterpart Chinese Application No. 201780037676.X, along with an English translation.

First Office Action dated Feb. 3, 2020, of counterpart Chinese Application No. 201780037676.X, along with an English translation.

The Third Office Action dated Mar. 12, 2021, of counterpart Chinese Application No. 201780037676.X, along with an English translation.

Supplementary Search dated May 24, 2021, of counterpart Chinese Application No. 201780037676.X, along with an English translation.

Notification to Grant Patent Right for Invention dated Jun. 7, 2021, of counterpart Chinese Application No. 201780037676.X, along with an English translation.

* cited by examiner

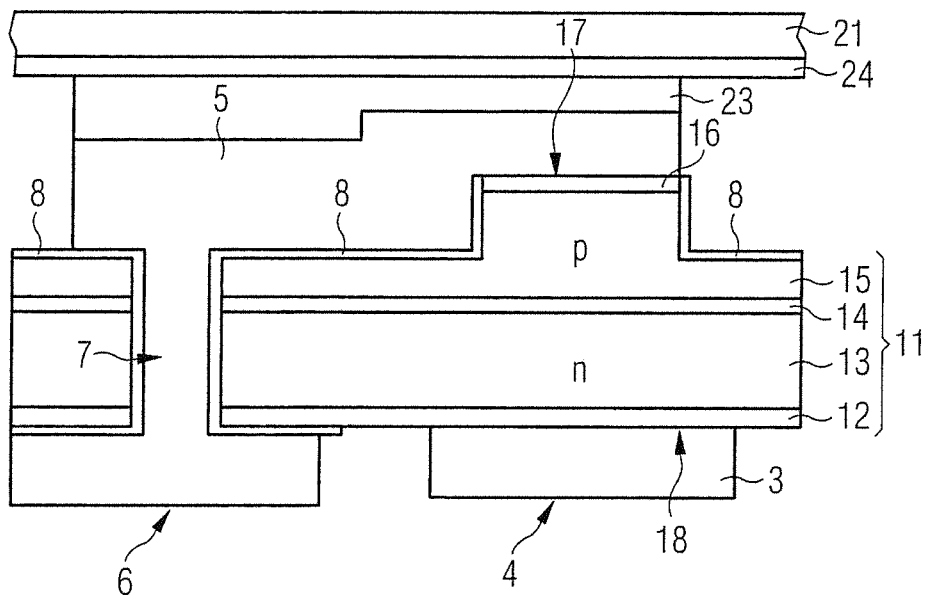
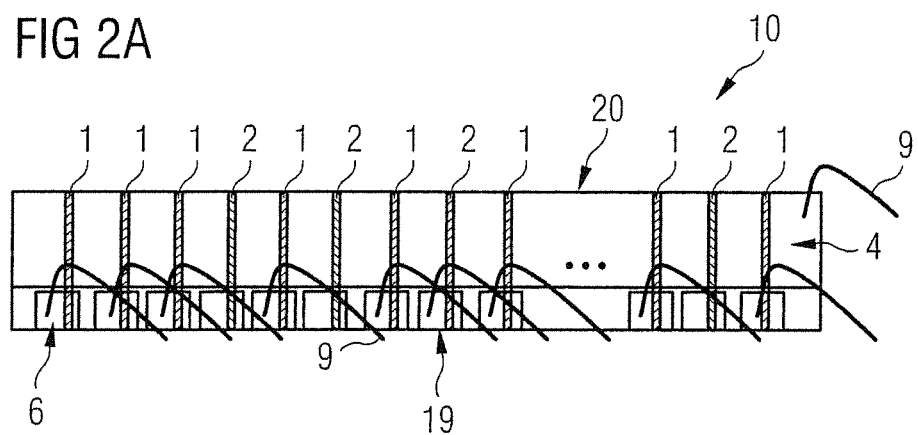
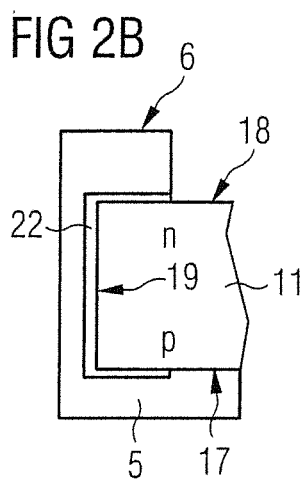

METHOD OF PRODUCING A LASER DIODE BAR AND LASER DIODE BAR

TECHNICAL FIELD

This disclosure relates to a method of producing a laser diode bar and a laser diode bar produced by the method.

BACKGROUND

Methods are intended for laser diode bars based on a nitride compound semiconductor material, in particular InAlGaN, are known. Such laser diode bars can emit radiation in the visible spectral range in particular. However, production of efficient laser diode bars from nitride compound semiconductors is difficult because in such material systems compared to other material systems such as InAlGaAs, higher defect densities can occur.

It could therefore be helpful to provide a laser diode bar and a process for its production, wherein the laser diode bar has improved efficiency.

SUMMARY

We provide a method of producing a laser diode bar including producing a plurality of emitters arranged side by side, the emitters each including a semiconductor layer sequence having an active layer that generates laser radiation, a p-contact on a first main surface of the laser diode bar and an n-contact on a second main surface of the laser diode bar opposite the first main surface, testing at least one optical and/or electrical property of the emitters, wherein emitters in which the optical and/or electrical property lies within a predetermined setpoint range are assigned to a group of first emitters, and emitters in which the at least one optical and/or electrical property lies outside the predetermined setpoint range are assigned to a group of second emitters, and electrically contacting the first emitters, wherein the second emitters are not electrically contacted so that they are not supplied with current during operation of the laser diode bar.

We also provide a laser diode bar including a plurality of emitters arranged side by side, the emitters each having a semiconductor layer sequence with an active layer that generates laser radiation, a p-contact on a first main surface of the laser diode bar and an n-contact on a second main surface of the laser diode bar opposite the first main surface, wherein the laser diode bar includes a group of first emitters that are electrically contacted and a group of second emitters that are not electrically contacted.

We further provide a method of producing a laser diode bar including producing a plurality of emitters arranged side by side, the emitters each including a semiconductor layer sequence having an active layer that generates laser radiation, a p-contact on a first main surface of the laser diode bar and an n-contact on a second main surface of the laser diode bar opposite the first main surface, testing at least one optical and/or electrical property of the emitters, wherein emitters in which the optical and/or electrical property lies within a predetermined setpoint range are assigned to a group of first emitters, and emitters in which the at least one optical and/or electrical property lies outside the predetermined setpoint range are assigned to a group of second emitters, and electrically contacting the first emitters, wherein the second emitters are not electrically contacted so that they are not supplied with current during operation of the laser diode bar, and the second emitters include faulty emitters having a defect or do not contribute sufficiently to the emission of radiation.

BRIEF DESCRIPTION OF THE DRAWINGS

FIG. 1C shows a schematic illustration of a cross-section through a section of an emitter in an alternative variant of the first example.

FIG. 2A shows a schematic illustration of a top view of a laser diode bar according to a second example.

FIG. 2B shows a schematic illustration of a cross-section through a section of an emitter in the second example.

Figure 1A:
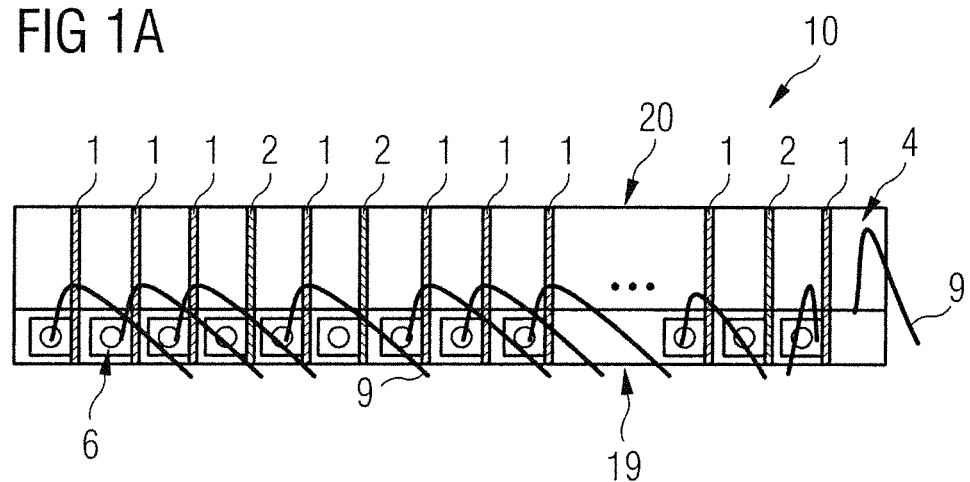
FIG. 1A shows a schematic illustration of a top view of a laser diode bar according to a first example.

REFERENCES 1 first emitter
2 second emitter
3 n-connection layer
4 n-connection area
5 p-connection layer
6 p-connection area
7 opening
8 electrically insulating layer
9 bonding wire
10 laser diode bar
11 semiconductor layer sequence
12 n-contact
13 n-type semiconductor area
14 active layer
15 p-type semiconductor area
16 p-contact
17 first main surface
18 second main surface
19 side facet
20 side facet
21 carrier
22 electrically insulating layer
23 electrically insulating layer
24 connecting layer

DETAILED DESCRIPTION

In our process of producing a laser diode bar, a plurality of emitters arranged side by side may be produced, the emitters being advantageously separately electrically contactable. In particular, the emitters each have a semiconductor layer sequence that emit laser radiation. The semiconductor layer sequence of the emitters, for example, each has an n-type semiconductor region, a p-type semiconductor region and an active layer arranged in between that generate laser radiation. The n-type semiconductor region, the active layer and the p-type semiconductor region can each have one or more sublayers. It is possible that the n-type semiconductor region, the active layer and the p-type semiconductor region contain one or more undoped layers.

Furthermore, the emitters each have a p-contact on a first main surface of the laser diode bar and an n-contact on a second main surface opposite the first main surface. In other words, the p-contact and the n-contact face each other when seen from the active layer.

The first main surface can face a carrier such as a heat sink and serve as the mounting surface for the laser diode bar. The second main surface can be a surface of the laser diode bar facing away from the carrier.

In the method, at least one optical and/or electrical property of the emitters is tested. Those emitters in which the optical and/or electrical property lies within a specified setpoint range are assigned to a group of first emitters. On the other hand, emitters in which the optical and/or electrical property lies outside the specified setpoint range are assigned to a group of second emitters.

The assignment of the emitters to the group of the first emitters or group of the second emitters can, for example, be achieved by carrying out a test operation of the emitters and measuring the at least one electrical and/or optical property. In the test operation, the emitters can be electrically contacted at least temporarily and operated with an electric current. The electrical and/or optical property can in particular be the emitted intensity at a given current intensity. Furthermore, the electrical and/or optical property tested with the emitters can be, for example, a threshold current at which the laser emission of the emitters starts.

In a subsequent method step, the first emitters are electrically contacted. Electrical contacting can in particular involve establishing current supply lines to the first emitters intended to supply the first emitters with an electrical current during operation of the laser diode bar. In particular, bond wires can be provided as current supply lines.

On the other hand, the second emitters are not electrically contacted so that they are not supplied with power during operation of the laser diode bar. For example, the first emitters may be contacted with bond wires, while the emitters of the second group have at least one of the electrical contacts, e.g., the p-contact, not provided with a current supply such as a bond wire. Alternatively, it can also be provided, for example, that first both electrical contacts of all emitters are provided with a current supply line such as a bond wire, and then the current supply line of at least one electrical contact of the second emitters is removed again or cut through. For this purpose, for example, a bond wire intended for the electrical connection can be cut through or removed.

The method ensures that during operation of the finished laser diode bar only those emitters are supplied with current for which the at least one tested electrical and/or optical property lies within the specified setpoint range. It is advantageously prevented that during operation of the laser diode bar those emitters are also supplied with power which, for example, due to manufacturing tolerances and/or a defect, do not contribute or at least do not contribute sufficiently to emission of radiation.

The group of second emitters may in particular include faulty emitters in which the threshold-current is not exceeded at the intended operating current.

The fact that such faulty emitters are not electrically connected in the process prevents them from having a current flow during operation of the finished laser diode bar and contributing to the heating of the laser diode bar, but not to radiation emission. By avoiding an electrical connection of the faulty emitters, the current consumption of the laser diode bar is reduced and efficiency is improved.

The n-contact of the emitters may connect to an n-connection layer arranged on the second main surface and has an n-connection area. In particular, the n-connection area can face away from a carrier of the laser diode bar. The n-connection area can be configured as a common n-connection area for all emitters of the laser diode bar. In particular, the n-connection layer can be a metal layer.

Preferably, the p-contact of the emitters connects to a p-connection layer, which is led from the first main surface through an opening in the semiconductor layer sequence to the second main surface and forms a p-connection area on the second main surface. The p-connection layer, like the n-connection layer, can in particular be a metal layer. The n-connection area and the p-connection area can be exposed on the second main surface in particular and can therefore be electrically contacted from the outside with a current supply line such as a bonding wire.

The p-contact of the emitters may connect by a p-connection layer, which is led from the first main surface via a side facet of the laser diode bar to the second main surface. In this case, the p-connection layer advantageously has a p-connection area on the second main surface of the laser diode bar. In this case, both the n-connection area and the p-connection area of the emitters are arranged on the second main surface of the laser diode bar, as described above. The n-connection area and the p-connection area are particularly exposed on the second main surface and can thus be advantageously electrically contacted from the outside with a current supply line such as a bonding wire.

The laser diode bar may be mounted on a carrier at the first main surface. The carrier can, for example, be a submount or a heat sink. In this configuration, the p-contact of the emitters can connect to a p-connection layer connected to an electrically conductive connection layer on the carrier. In this configuration, the connection layer on the substrate can comprise the p-connection area. In this case, the p-connection area on the substrate is formed by a surface of the electrically conductive connection layer. The p-connection areas of the emitters can be arranged on the carrier, in particular next to the laser diode bar. The p-connection areas are preferably exposed on the surface of the carrier and are thus freely accessible from the outside.

Electrical contacting of the first emitters may comprise providing the p-connection areas of the first emitters with a current supply line such as a bonding wire.

On the other hand, the p-connection areas of the second emitters are preferably not provided with a current supply line so that these are not supplied with power in the finished laser diode bar. For example, no bonding wire is attached to the p-connection areas of the second emitters, or a previously attached bonding wire is removed or cut through.

The process is particularly advantageous for laser diode bars having a semiconductor layer sequence based on a nitride compound semiconductor material. In particular, the semiconductor layer sequence can include layers from the $In_xAl_yGa_{1-x-y}N$ material system, where $0 \leq x \leq 1$, $0 \leq y \leq 1$ and $x+y \leq 1$. During production of the nitride compound semiconductor layers, it is possible that higher defect densities occur compared to other material systems such as arsenide compound semiconductors. In particular, this can result in the emitter's threshold currents deviating from each other. At a given operating current, it would therefore be possible for individual emitters of the laser diode bar not to emit laser light, but consume current and contribute to heating the laser diode bar. With our method, this effect is reduced by detecting faulty emitters during production and not electrically connecting them when the laser diode bar is completed.

Furthermore, a laser diode bar can be produced using our method. The laser diode bar may comprise a plurality of emitters arranged side by side. In particular, each emitter represents a laser diode. The emission directions of the emitters are particularly parallel to each other. The laser diode bar preferably has a first and a second side facet preferably provided with a reflective coating to form a laser resonator for the emitters. In this case, one of the side facets functions advantageously as the radiation exit surface for the laser beam and preferably has a lower reflectivity than the opposite side facet.

The laser diode bar preferably comprises a first group of emitters electrically contacted and a second group of emitters not electrically contacted. In particular, both the p-contact and the n-contact of the first emitters are each provided with a current-supply line to supply the emitter with current during operation of the laser diode bar. The second emitters do not have a current supply line for the p-contact and/or the n-contact so that the second emitters are not supplied with current when the laser diode bar is in operation. In particular, the p-connection areas of the first emitters may each be contacted by a bonding wire, but the p-connection areas of the second emitters need not be each contacted by a bonding wire or the bonding wire is severed.

Further advantageous examples of the laser diode bar result from the previous description of the manufacturing process and vice versa.

Our methods and laser diode bars are explained in more detail below with examples.

Identical or equivalent components are provided in the figures with the same reference signs. The components shown as well as the proportions of the components among each other are not to be regarded as true to scale.

Figure 1B:
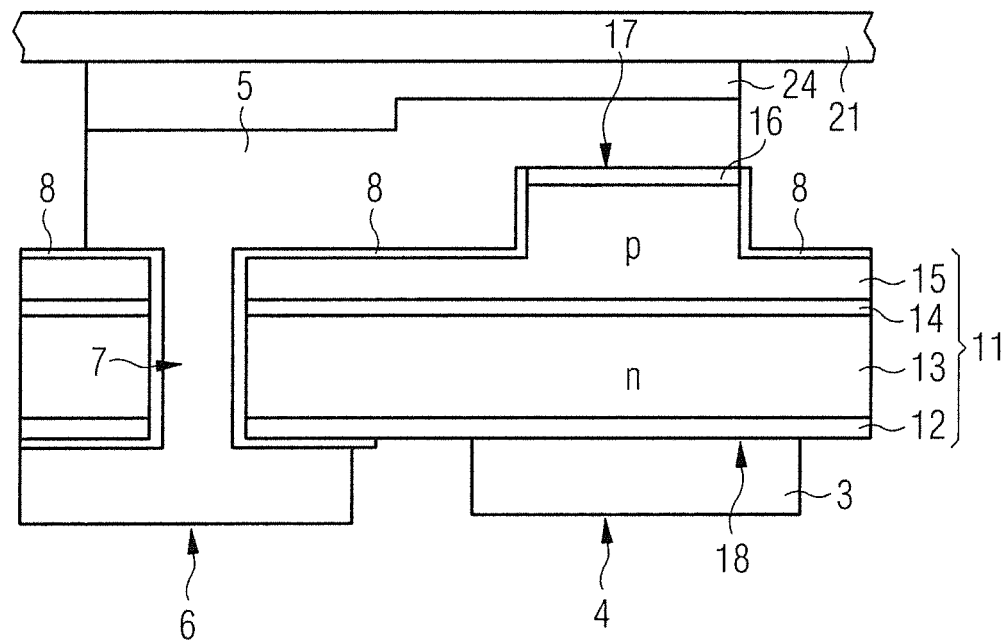
FIG. 1B shows a schematic illustration of a cross-section through a section of an emitter in the first example.

FIGS. 1A and 1B show an example of the laser diode bar 10 schematically in top view and cross-section.

As can be seen in the top view, the laser diode bar 10 has a plurality of emitters 1, 2 arranged side-by-side. The emitters 1, 2 each have a semiconductor layer sequence 11 having an n-type semiconductor region 13, a p-type semiconductor region 15 and an active layer 14 arranged between the n-type semiconductor region 13 and the p-type semiconductor region 15. The semiconductor layer sequence 11 may be at least partially severed between emitters 1, 2, for example, by mesa etching through the p-type semiconductor region 15 (not shown).

The semiconductor layer sequence 11 can in particular be based on a nitride compound semiconductor. This means that the semiconductor layer sequence 11 or at least one layer thereof comprises a III-nitride compound semiconductor material, preferably $In_xAl_yGa_{1-x-y}N$, where $0 \le x \le 1$, $0 \le y \le 1$ and $x+y \le 1$. This material does not necessarily have to have a mathematically exact composition according to the above formula. Rather, it may contain one or more dopants and additional constituents. For simplicity's sake, however, the above formula contains only the essential components of the crystal lattice (In, Al, Ga, N), even if these may be partially replaced by small amounts of other substances.

The active layer 14 can, for example, be in the form of a pn-junction, a double heterostructure, a single quantum well structure or a multiple quantum well structure. The term quantum well structure covers any structure in which charge carriers experience a quantization of their energy states by confinement. In particular, the term quantum well structure contains no information about the dimensionality of the quantization. It includes quantum wells, quantum wires and quantum dots and any combination of these structures.

The laser diode bar 10 has side facets 19, 20 that form a laser resonator for radiation generated in the active layer 14. One of the side facets 19, 20 or both side facets 19, 20 can be provided with a reflection-increasing coating. A side facet 20 of the laser diode bar 10 serves as radiation exit surface for the generated laser radiation. In this case, it is advantageous if the side facet 20 serving as the radiation exit surface has a lower reflectivity than the opposite side facet 19. The side facet 20 serving as the radiation exit surface may be uncoated or have a reflection-reducing or reflection-increasing coating. The adjacent emitters 1, 2 of the laser diode bar 10 each have a p-contact 16 on a first main surface 17 and an n-contact 12 on a second main surface 18 opposite the first main surface 17. As shown in the cross-section in FIG. 1B, the n-contact 12 connects to an n-connection layer 3 arranged on the second main surface 18 and forms an n-connection area 4 there. The n-connection area 4 can be used in particular for electrical contacting by a bonding wire 9.

In the example of FIGS. 1A and 1B, the p-contact 16 connects to a p-connection layer 5, which is led from the first main surface 17 through an opening 7 in the semiconductor layer sequence 11 to the second main surface 18. The opening 7 leads in particular through the active layer 14, whereby side walls of the opening 7 are advantageously provided with an electrically insulating layer 8 to avoid a short circuit. The opening 7 can have any cross-section, e.g., round or rectangular. By passing the p-connection layer 5 through the opening 7, it is achieved that the p-connection layer 5 has a p-connection area 6 which, like the n-connection area 4, is arranged on the second main surface 18 of the laser diode bar 10. The n-connection area 4 and the p-connection area 6 are advantageously free on the second main surface 18 of the laser diode bar 10 and therefore freely accessible from the outside to be electrically contacted. As the p-connection layer 5 leads to the second main surface 18, the p-connection area 6 of the p-connection layer 5 is also accessible from the outside for electrical contacting, for example, by a bonding wire if the laser diode bar 10 is mounted on the first main surface 17 on a carrier such as a heat sink.

The laser diode bar can, for example, connect to a carrier 21, in particular a heat sink, by a connecting layer 24 such as a solder layer. In this example, it must be avoided that the areas of the p-connection layers 5 of adjacent emitters 1, 2 arranged on the first main surface 17 electrically connect to each other by the connecting layer 24 or the carrier 21, if this is electrically conductive. Preferably, a non-conductive carrier 21 is used which, for example, comprises a ceramic. The non-conductive carrier 21 advantageously has a structured electrically conductive connecting layer 24 that individually contacts the emitters 1, 2 individually.

Alternatively, as shown in FIG. 1C, an electrically insulating layer 23 is arranged between the area of the p-connection layer 5 on the first main surface 17 and the electrically conductive connection layer 24 at each emitter. In this example, the electrically conductive connecting layer 24 can be applied over the entire surface of carrier 21.

The method of manufacturing the laser diode bar 10 makes use, among other things, of the free accessibility of the n-connection area 4 and the p-connection area 6 on the second main surface 18 to selectively contact the emitters 1, 2. As can be seen in the top view in FIG. 1A, not all emitters 1, 2 of the laser diode bar 10 are electrically contacted. The emitters 1, 2 have a common n-connection area 4 electrically contacted by a bonding wire 9. On the other hand, the p-connection areas 6 only connect to a bonding wire 9 for a group of first emitters 1, whereas the p-connection areas 6 have no bonding wire for a group of second emitters 2. The second emitters 2 are therefore not supplied with power during operation of the laser diode bar 10. In this way, it is advantageously possible to cut off the current supply to defective emitters 2 that contribute only insufficiently to the radiation emission. Such defective emitters 2 would otherwise generate heat loss during operation of the laser diode bar 10 and contribute to heating of the laser diode bar 10, but would not contribute to radiation emission.

To detect faulty emitters 2, at least one optical and/or electrical property of the emitters 1, 2 is advantageously tested in the process of producing the laser diode bar 10. The testing of emitters 1, 2 may in particular include an optical check of the emitters and/or a test electrical connection of emitters 1, 2 to measure at least one optical and/or electrical property. For example, the emitted intensity at a given current and/or the threshold current at which the laser emission of emitters 1, 2 starts can be determined. Emitters 1 in which the at least one tested optical and/or electrical property lies within a setpoint range are assigned to a group of first emitters 1 electrically connected upon completion of the laser diode bar 10. On the other hand, faulty emitters 2 in which the at least one tested optical and/or electrical property is not within a predetermined setpoint range are assigned to a group of second emitters 2, and are not electrically connected when the laser diode bar 10 is completed. In particular, at least one of the connection areas 4, 6 of the second emitters 2 need not connect to a current supply line such as a bonding wire 9. In the example shown here, the p-connection areas 6 of the second emitters 2 have not been provided with a bonding wire 9 and are therefore cut off from the power supply during operation of the laser diode bar 10. As the faulty second emitters 2 are not supplied with power, the efficiency of the laser diode bar 10 increases advantageously.

FIG. 2A shows another example of the laser diode bar 10 in a top view, and FIG. 2B shows a cross-section of a section of the laser diode bar 10 at the side facet 19 opposite the side facet 20 serving as the radiation exit surface. As in the previous example, both the common n-connection area 4 of the emitters 1, 2 and the separate p-connection areas 6 of the emitters 1, 2 are arranged on the second main surface 18 of the laser diode bar 10 and freely accessible there for the production of a current supply line, in particular by bonding wires 9.

The difference to the previous example is that the p-connection layer 5 is not routed through the semiconductor layer sequence 11 from the first main surface 17 to the second main surface 18, but via the side facet 19 of the laser diode bar 10 as shown in FIG. 2B. To avoid a short circuit, the side facet 19 is provided with an electrically insulating layer 22 that may in particular be a dielectric mirror. The dielectric mirror may have several sublayers (not shown). The electrically insulating layer 22 can thus function simultaneously as a reflective coating of the side facet 19 to form a resonator mirror and as electrical insulation between the layers of the semiconductor layer sequence 11, in particular the n-type semiconductor region, and the p-connection layer 5. As in the previous example, the laser diode bar 10 can connect to a carrier, in particular a heat sink, by a connecting layer. To simplify matters, the carrier and the connecting layer are not shown here again, although their design may correspond to that of FIGS. 1B and 1C.

In particular, a non-conductive carrier that, for example, comprises a ceramic can be used to avoid an electrical connection of adjacent emitters 1, 2, wherein the non-conductive carrier advantageously comprises a structured electrically conductive connecting layer which contacts the emitters 1, 2 individually in each example. Alternatively, an electrically insulating layer can be arranged between the region of the p-connection layer 5 on the first main surface 17 and the electrically conductive connection layer at each emitter. In this example, the electrically conductive connecting layer can be applied to the entire surface of the carrier.

The structure, function and manufacturing process of the laser diode bar 10 are otherwise essentially the same as in the previous example and are therefore not explained in detail here.

Figure 3A:
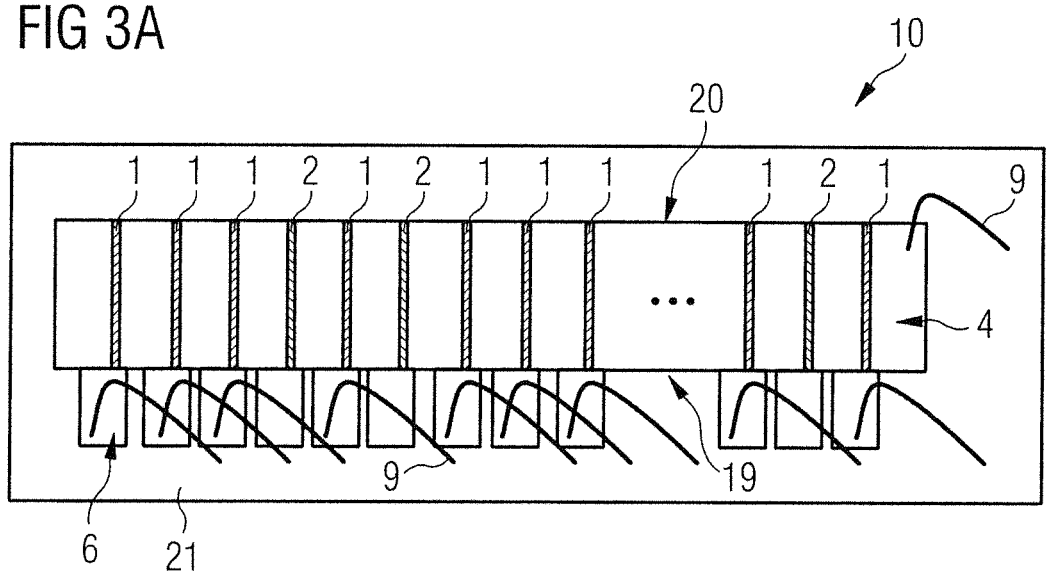
FIG. 3A shows a schematic illustration of a top view of a laser diode bar according to a third example.
Figure 3B:
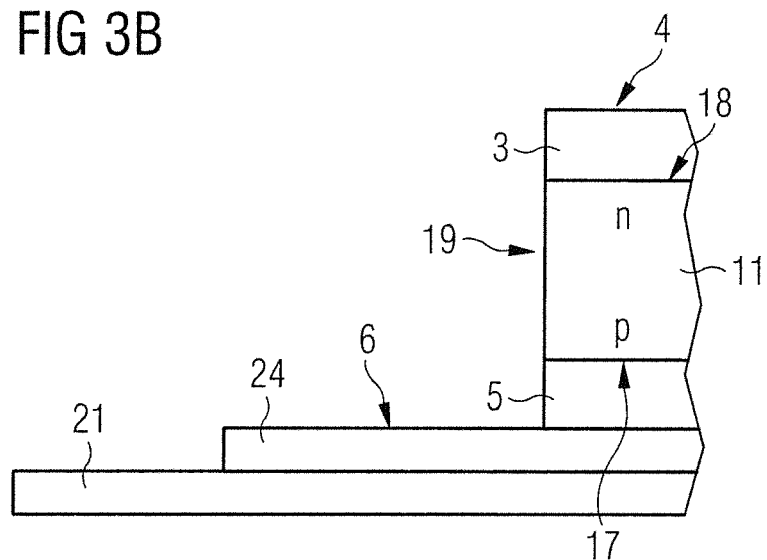
FIG. 3B shows a schematic illustration of a cross-section through a section of an emitter in the third example.

FIG. 3A shows another example of the laser diode bar 10 in a top view, and FIG. 3B shows a cross-section through a section of the laser diode bar 10 at the side facet 19 opposite to the side facet 20 serving as the radiation exit surface. In this example, the emitters 1, 2 have a common n-connection surface 4 on the second main surface 18 of the laser diode bar 10, as in the previous examples. In contrast to the previous examples, the p-connection areas 6 of the emitters are not arranged on the second main surface 18 of the laser diode bar 10. Rather, the laser diode bar 10 is mounted on a carrier 21 at the first main surface 17 where the p-connection layer 5 is located. The p-connection layer 5 connects to an electrically conductive connecting layer 24 that can, for example, be a solder layer. The electrically conductive connecting layer 24 extends onto carrier 21 so that it has a p-connection area 6 freely accessible on carrier 21. As in the previous examples, the first emitters 1 are selectively contacted electrically with bonding wires 9 via the p-connection areas 6, while the p-connection areas 6 of the faulty second emitters 2 are not provided with bonding wires 9.

With regard to further details and advantageous configurations, the third example corresponds to the previous examples.

Our methods and laser diode bars are not limited to the examples by the description on the basis of the examples. Rather, this disclosure encompasses any new feature and also any combination of features that in particular comprises any combination of features in the appended claims and any combination of features in the examples, even if the feature or combination itself is not explicitly specified in the claims or examples.

This application claims priority of DE 10 2016 111 058.2, the subject matter of which is incorporated herein by reference.

The invention claimed is:
1. A method of producing a laser diode bar comprising:
producing a plurality of emitters arranged side by side, the emitters each comprising a semiconductor layer sequence having an active layer that generates laser radiation, a p-contact on a first main surface of the laser diode bar and an n-contact on a second main surface of the laser diode bar opposite the first main surface, wherein the p-contact connects to a p-connection layer and the p-contact has a p-connection area on the second main surface, and wherein (i) the p-connection layer is guided from the first main surface through an opening in the semiconductor layer sequence to the second main surface or (ii) the p-connection layer is routed from the first main surface via a side facet of the laser diode bar to the second main surface,
testing at least one of either or both of an optical and an electrical property of the emitters, wherein emitters in which the at least one or both of the optical and the electrical property lies within a predetermined setpoint range are assigned to a group of first emitters, and emitters in which the at least one of the optical and the electrical property lies outside the predetermined setpoint range are assigned to a group of second emitters, and electrically contacting the first emitters, wherein the second emitters are not electrically contacted so that they are not supplied with current during operation of the laser diode bar, the n-contact connects to an n-connection layer arranged on the second main surface and forms an n-connection area, and the n-connection area is formed as a common connection area for all emitters of the laser diode bar.

2. The method according to claim 1, wherein the laser diode bar is mounted at the first main surface on a carrier by a connecting layer, the p-contact electrically conductively connects to the connecting layer by a p-connection layer, and the connecting layer has a p-connection area on the carrier.

3. The method according to claim 1, wherein the electrical contacting of the first emitters comprises the p-connection areas of the first emitters each being provided with a current supply line.

4. The method according to claim 3, wherein the p-connection areas of the second emitters are not provided with a current supply line.

5. The method according to claim 1, wherein the semiconductor layer sequence comprises a nitride compound semiconductor material.

6. A laser diode bar comprising a plurality of emitters arranged side by side, the emitters each having a semiconductor layer sequence with an active layer that generates laser radiation, a p-contact on a first main surface of the laser diode bar and an n-contact on a second main surface of the laser diode bar opposite the first main surface, wherein 1) the laser diode bar comprises a group of first emitters that are electrically contacted and a group of second emitters that are not electrically contacted, and the n-contact connects to an n-connection layer disposed on the second main surface and has an n-connection area, and 2) the p-contact connects to a p-connection layer and the p-connection layer has a p-connection area on the second main surface, wherein (i) the p-connection layer is guided from the first main surface through an opening in the semiconductor layer sequence to the second main surface or (ii) the p-connection layer is guided from the first main surface via a side facet of the laser diode bar to the second main surface.

7. The laser diode bar according to claim 6, wherein the p-connection areas of the first emitters are electrically contacted by a current supply line, and the p-connection areas of the second emitters are not contacted by a current supply line.

8. The laser diode bar according to claim 7, wherein each current supply line comprises at least one bonding wire.

9. The laser diode bar according to claim 6, wherein the semiconductor layer sequence comprises a nitride compound semiconductor material.

* * * * *